United States Patent
Welker et al.

(10) Patent No.: US 8,300,464 B2
(45) Date of Patent: Oct. 30, 2012

(54) METHOD AND CIRCUIT FOR CALIBRATING DATA CAPTURE IN A MEMORY CONTROLLER

(75) Inventors: James A. Welker, Leander, TX (US); Jose M. Nunez, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 378 days.

(21) Appl. No.: 12/759,306

(22) Filed: Apr. 13, 2010

(65) Prior Publication Data

US 2011/0249522 A1    Oct. 13, 2011

(51) Int. Cl.
*G11C 11/34* (2006.01)

(52) U.S. Cl. .................................. 365/185.09

(58) Field of Classification Search ............. 365/185.09
See application file for complete search history.

(56) References Cited

U.S. PATENT DOCUMENTS

| | | |
|---|---|---|
| 3,633,174 A | 1/1972 | Griffin |
| 3,656,106 A | 4/1972 | Stein |
| 5,764,703 A | 6/1998 | Charvin et al. |
| 6,118,731 A | 9/2000 | Huang et al. |
| 6,480,946 B1 | 11/2002 | Tomishima et al. |
| 6,584,021 B2 | 6/2003 | Heyne et al. |
| 6,600,681 B1 | 7/2003 | Korger et al. |
| 6,680,866 B2 | 1/2004 | Kajimoto |
| 6,715,096 B2 | 3/2004 | Kuge |
| 6,996,749 B1 | 2/2006 | Bains et al. |
| 7,002,378 B2 | 2/2006 | Srikanth et al. |
| 7,036,053 B2 | 4/2006 | Zumkehr et al. |
| 7,042,799 B2 | 5/2006 | Cho |
| 7,043,611 B2 | 5/2006 | McClannahan et al. |
| 7,057,934 B2 | 6/2006 | Krishnamachari et al. |
| 7,106,646 B2 | 9/2006 | Schoenfeld et al. |
| 7,165,185 B2 | 1/2007 | Li et al. |
| 7,171,321 B2 | 1/2007 | Best |
| 7,209,396 B2 | 4/2007 | Schnell |
| 7,215,584 B2 | 5/2007 | Butt et al. |
| 7,277,333 B2 | 10/2007 | Schaefer |
| 7,366,862 B2 | 4/2008 | Nystuen et al. |
| 7,394,707 B2 | 7/2008 | Seto et al. |
| 7,443,741 B2 | 10/2008 | Butt et al. |
| 7,463,534 B2 | 12/2008 | Ku et al. |

(Continued)

OTHER PUBLICATIONS

U.S. Appl. No. 12/500,975, "Circuit for Controlling Data Communiction with Synchronous Storage Circuitry and Method of Operation", Inventors James G. Gay et al., filed Jul. 10, 2009.

*Primary Examiner* — Hoai V Ho
*Assistant Examiner* — Pablo Huerta
(74) *Attorney, Agent, or Firm* — Daniel D. Hill (57) ABSTRACT

A memory controller comprises a multiplexer, a first-in, first-out memory (FIFO), a comparator, and a detection and adjustment circuit. The multiplexer receives a clock signal, a reference voltage, and a gating signal. The FIFO has a clock input coupled to an output of the multiplexer and a data input that receives data from a memory. The comparator has a first input coupled to an output of the FIFO, and a second input coupled to receive a calibration pattern. The calibration pattern is predetermined to match with a first portion of data from the FIFO, and is predetermined to not match with a second portion of data from the FIFO. The detection and adjustment circuit detects if a transition from the first portion to the second portion occurs within a predetermined time period. If the transition is not detected within the time period, a timing of the gating signal is adjusted.

20 Claims, 4 Drawing Sheets

U.S. PATENT DOCUMENTS

| | | |
|---|---|---|
| 7,558,132 B2 | 7/2009 | Carnevale et al. |
| 7,573,759 B2 | 8/2009 | Hsieh et al. |
| 7,590,008 B1 | 9/2009 | Roge et al. |
| 2001/0014922 A1 | 8/2001 | Kuge |
| 2002/0138800 A1 | 9/2002 | Kim et al. |
| 2003/0226070 A1 | 12/2003 | Fukao et al. |
| 2004/0006870 A1 | 1/2004 | Sasu et al. |
| 2005/0105349 A1 | 5/2005 | Dahlberg et al. |
| 2006/0288175 A1 | 12/2006 | Seto et al. |
| 2007/0002642 A1 | 1/2007 | Butt et al. |
| 2007/0008791 A1 | 1/2007 | Butt et al. |
| 2007/0230266 A1 | 10/2007 | Kao |
| 2009/0240968 A1 | 9/2009 | Kizer et al. |

METHOD AND CIRCUIT FOR CALIBRATING DATA CAPTURE IN A MEMORY CONTROLLER

BACKGROUND

1. Field

This disclosure relates generally to integrated circuits, and more specifically, to a method and circuit for calibrating data capture in a memory controller.

2. Related Art

Synchronous dynamic random access memory (SDRAM) utilize one or more reference clock signals provided by a memory controller to manage data transfers via one or more data strobe signals in a data processing system. The input and output data of the SDRAM are synchronized in a predetermined relationship to the data strobe signals. Double data rate (DDR) SDRAMs allow data transfers at twice the clock rate in relationship to both the rising and falling edges of the data strobe.

Conventional DDR SDRAMs use a bi-directional data strobe signal commonly referred to as a DQS signal. A data strobe receiver receives the DQS signal from either the SDRAM or a memory controller and functions to provide a reference strobe signal to properly capture data. The memory controller may include a first-in, first-out memory (FIFO) to receive data read from the SDRAM. In some memory controller designs, it may be necessary to gate the DQS signal from the SDRAM when the DQS signal is not actively driven by the SDRAM. However, determining when to disable the DQS signal gating during a read from the SDRAM may be difficult if the timing is fixed in view of process, voltage, and temperature (PVT) variations, especially for higher-speed designs.

Therefore, what is needed is a memory controller and method for calibrating the DQS signal gating that solves one or more of the above problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a memory controller and method for calibrating data capture in the memory controller. The data capture is calibrated by adjusting the timing of a DQS gating signal. The memory controller is coupled to receive the data from an SDRAM. The calibration determines how much time will pass from the time the memory controller issues a read command to the time when a DQS signal arrives back to the memory controller. A known calibration data pattern is written to the memory. The calibration data pattern has a predetermined transition point from one data value to another data value. The calibration data pattern is read from the memory and compared to determine when the transition point occurred in the read data by sampling a predetermined time period after the read operation begins. If the transition is not detected within the predetermined time period, the gating signal timing is adjusted and the memory read iteratively until the transition from one data value to another data value is close to the first high to low transition of the DQS signal. In one embodiment, the DQS gating signal controls the data capture of a FIFO coupled to receive the data from the memory. Also, DQS gating signal may be calibrated each time the memory controller is powered up, or periodically to account for voltage and temperature changes.

In one aspect, there is provided, a method comprising: writing data comprising a first plurality of bits to a first memory, a first portion of the first plurality of bits being predetermined to match in a comparison with a second plurality of bits stored in a second memory, and a second portion of the first plurality of bits being predetermined to not match in a comparison with the second plurality of bits; setting a time delay of a gating signal to a first value, the gating signal for aligning data read from the first memory to a clock signal; serially reading the first plurality of bits from the first memory; comparing the first plurality of bits to the second plurality of bits; detecting if a transition from the first portion of the first plurality of bits to the second portion of the first plurality of bits occurs within a time period; if the transition occurs within the time period, resetting the first value of the time delay of the gating signal by a second value; and if the transition occurs outside of the time period, adjusting the delay of the gating signal to a third value and repeating the steps of serially reading, comparing, detecting, and adjusting until the transition occurs within the time period. The step of writing data may further comprise writing data comprising a first plurality of bits to a double data rate synchronous dynamic random access memory. The step of writing data may further comprise writing data comprising a first plurality of bits to first memory, the first memory being a dual data rate synchronous dynamic random access memory, a first portion of the first plurality of bits being predetermined to match in a comparison with a second plurality of bits stored in a second memory, the second memory being a internal register, and a second portion of the first plurality of bits being predetermined to not match in a comparison with the second plurality of bits. The step of setting a time delay of the gating signal to the first value may further comprise setting a time delay of the gating signal to the first value, wherein the first value is a minimum value. The step of adjusting the delay of the gating signal to a third value may further comprise adjusting the delay of the gating signal to a third value by incrementing the delay of the gating signal by less than one cycle of the clock signal. The step of resetting the first value of the time delay of the gating signal by a second value may further comprise resetting the first value of the time delay of the gating signal by subtracting one cycle of the clock signal from the first value. The step of serially reading the first plurality of bits from the first memory further comprises writing the serially read first plurality of bits to a first-in, first-out memory (FIFO). The step of comparing the first plurality of bits to the second plurality of bits may further comprise reading the first plurality of bits from the FIFO and to an input of a comparator for performing the comparing. The method may further comprise reading from the first memory using the gating signal having the time delay reset by the second value, wherein the reading is subsequent to the step of resetting the first value of the gating signal.

In another aspect, there is provided, in a data processing system having a memory controller for controlling access to a memory, a method for calibrating a gating signal with data read from the memory, the gating signal for aligning the data to a clock signal, the method comprising: entering a gating signal calibration mode; writing a first calibration data pattern to the memory, the first calibration data pattern having a first portion and a second portion; writing a second calibration data pattern to a register in the memory controller, the second calibration data pattern being equal to the first portion of the first calibration data pattern, and the second calibration pattern not being equal to the second portion of the first calibration data pattern; setting a time delay of the gating signal to a first value; reading the first calibration data pattern from the memory to the memory controller; comparing the first calibration data pattern to the second calibration data pattern bit-by-bit in response to the gating signal; detecting if a transition from the first portion of the first calibration data pattern to the second portion of the first calibration data pattern occurs within a time period; and if the transition does not occur within the time period, adjusting the time delay of the gating signal by a second value. The method may further comprise: re-reading the first calibration data pattern from the memory to the memory controller, comparing the first calibration data pattern to the second calibration data pattern bit-by-bit in response to the adjusted gating signal; detecting if a transition from the first portion of the first calibration data pattern to the second portion of the first calibration data pattern occurs within the time period; if the transition occurs within the time period, adjusting the adjusted gating signal by a third value; and exiting the calibration mode. The method may further comprise reading the data from the memory using the adjusted gating signal. The step of reading the first calibration data pattern from the memory to the memory controller may further comprise writing the first calibration data pattern to a first-in, first-out memory (FIFO) of the memory controller. The step of comparing the first calibration data pattern to the second calibration data pattern may further comprise resetting a write pointer of the FIFO to a first entry of the FIFO. The step of detecting if a transition from the first portion of the first calibration data pattern to the second portion of the first calibration data pattern further comprises determining if the transition occurs at a predetermined entry of the FIFO.

In yet another aspect, there is provided, a memory controller comprising: a logic circuit having a first input for receiving a clock signal, a second input coupled to a reference voltage, a control input for receiving a gating signal, and an output; a first-in, first-out memory (FIFO) having a clock input coupled to the output of the logic circuit, a data input coupled to receive data from a memory, and an output; a comparator having a first input coupled to a the output of the FIFO, a second input coupled to receive a calibration pattern, the calibration pattern predetermined to match with a first portion of data from the FIFO, and the calibration pattern predetermined to not match with a second portion of data from the FIFO; and a detection and adjustment circuit for detecting if a transition from the first portion of the data to the second portion of the data occurs within a predetermined time period, and in response to detecting that the transition does not occur within the predetermined time period, causing a timing of the gating signal to be adjusted. The memory may be characterized as being a double data rate synchronous dynamic random access memory. The clock signal may comprise a preamble portion, a toggling portion, and a postamble portion. The data may be loaded into the FIFO on both rising and falling edges of the toggling portion of the clock signal. The FIFO may further comprise a read pointer, wherein the transition occurs on a predetermined read pointer location when the transition is within the predetermined time period.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Figure 1:
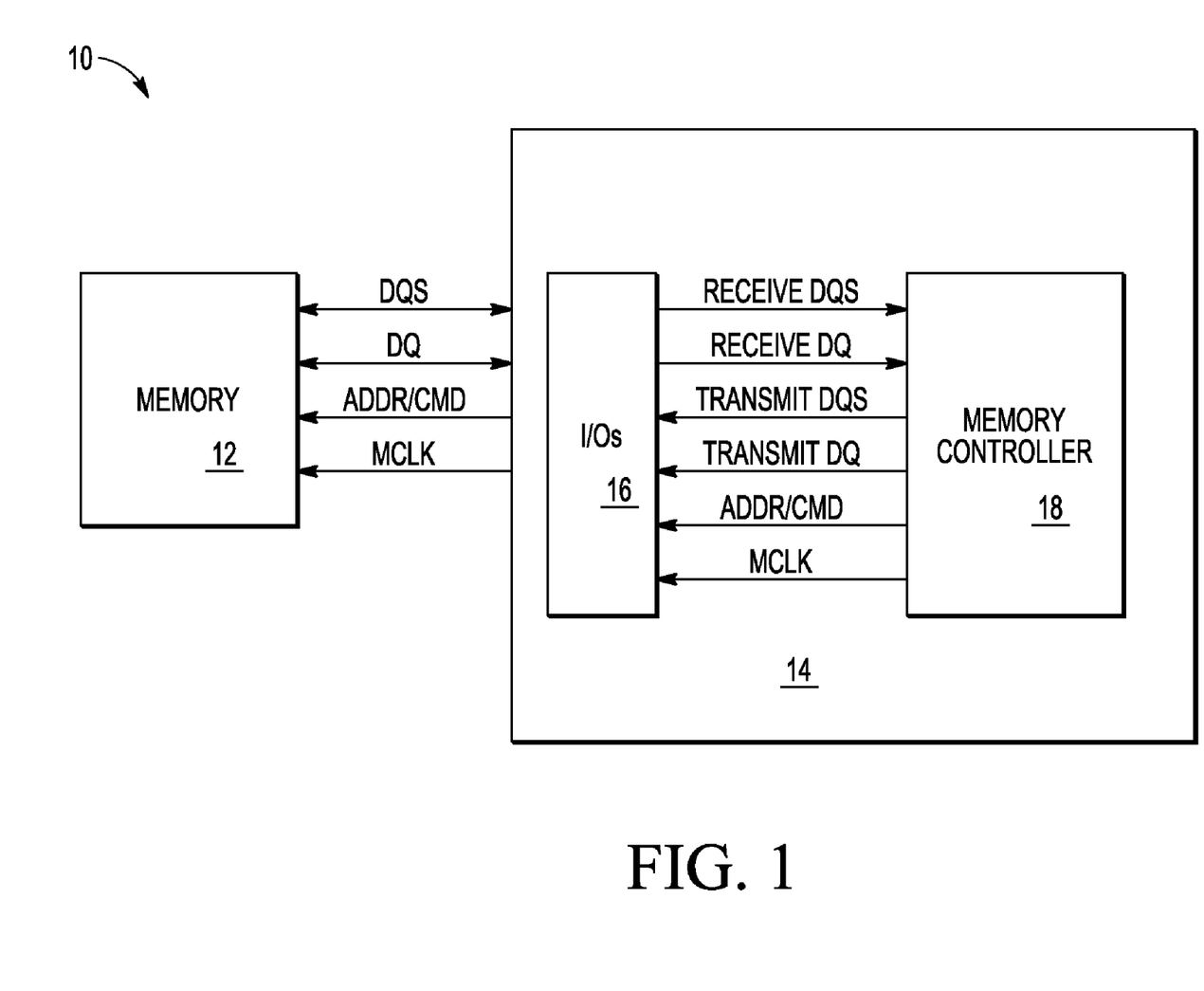
FIG. 1 illustrates, in block diagram form, a data processing system in accordance with an embodiment.

FIG. 1 illustrates, in block diagram form, data processing system 10 in accordance with an embodiment. Data processing system 10 includes memory 12 and data processor 14. In one embodiment, memory 12 is a double data rate (DDR) synchronous random access memory (SDRAM). In another embodiment, memory 12 may be another memory type. Data processor 14 includes input/output (I/O) circuits 16 and memory controller 18, and other circuits such as one or more processor cores, special purpose modules, cache memory, and the like, that are not illustrated in FIG. 1 for the purposes of simplicity and clarity. Memory 12 is coupled to data processor 14 via a plurality of signal lines or conductors including a bidirectional line for sending and receiving a data strobe signal labeled "DQS", a plurality of bidirectional data lines labeled "DQ", a plurality of address and command lines labeled "ADDR/CMD" for providing address and command information to memory 12, and a clock line for providing a memory clock signal labeled "MCLK" to memory 12. Note that the signals depicted herein, such as the DQS signal and clock signal MCLK may be differential signals. Also, data processor 14 may use multiple DQS signals and corresponding DQ buses to communicate to a plurality of memory devices.

I/O circuits 16 includes a plurality of I/O circuits for transmitting and receiving data from memory 12. In the embodiment illustrated in FIG. 1, memory controller 18 includes a plurality of input and output terminals connected to a plurality of input and output terminals of I/O circuits 16. For example, memory controller 18 has an input for receiving a data strobe labeled "RECEIVE DQS", an input terminal for receiving data signals labeled "RECEIVE DQS", an output terminal for transmitting a data strobe labeled "TRANSMIT DQS", an output terminal for transmitting data signals labeled "TRANSMIT DQ", an output terminal for providing address and command information labeled "ADDR/CMD", and a clock terminal for providing a clock signal for timing memory operations labeled "MCLK". Other embodiments may include more than one RECEIVE DQS signal and corresponding RECEIVE DQ signals. Also, other embodiment may include more than one TRANSMIT DQS signals and corresponding TRANSMIT DQ signals.

Generally, DDR SDRAM memory controllers and SDRAM use the DQS signals to send data to the SDRAM (write transfers) and receive data from the SDRAM (read transfers). The DQS signal functions as a reference timing signal to enable data capture. It is a requirement of industry standards that data be centered about DQS transitions meeting setup and hold time requirements of the SDRAM for write transfers performed by an SDRAM controller and valid between DQS transitions from the SDRAM for read transfers performed by an SDRAM controller. Industry standards define several states of DQS before, during and after a transfer of data. Before a transfer of read data, DQS is in a high-impedance state that is known as Hi-Z. When DQS is in Hi-Z, DQS is at an undefined voltage level between logic high and logic low. In the clock cycle immediately before a data read transfer, DQS transitions from the Hi-Z high-impedance state to a logic low. This logic low state is known as a data strobe preamble. After the data strobe preamble, the DQS signal toggles between a logic high and a logic low coincident with valid data driven by the memory. The one half clock before the data transfer is complete, while DQS is in a logic low state, is known as the data strobe postamble. After completion of the postamble, the DQS data strobe signal again enters the Hi-Z high-impedance state provided another transfer does not immediately begin. A gating signal may be used to release the DQS signal to time a first-in, first-out memory (FIFO). The gating signal must be properly synchronized with the DQS signal so that the data is loaded into the FIFO with the correct timing. Because the DQS strobe signal is not driven until the data strobe preamble starts and is again stopped from being driven at the end of a transaction in the postamble, it is important that a data strobe receiver, such as for example a multiplexer, be turned on and off with the gating signal at precisely the correct time in order to generate an internal DQS strobe signal with the correct timing. Otherwise indeterminate control signal values may be generated or the internal DQS strobe signal may latch the wrong data signal resulting in erroneous loading of data in the FIFO.

The illustrated embodiment presents a memory controller 18 having a calibration mode for ensuring the DQS signal is synchronized with the gating signal for read accesses to memory 12. In one embodiment, the calibration mode is entered automatically each time a power on reset (POR) occurs. In another embodiment, the calibration mode may be entered periodically to adjust the timing for voltage and temperature variations.

Figure 2:
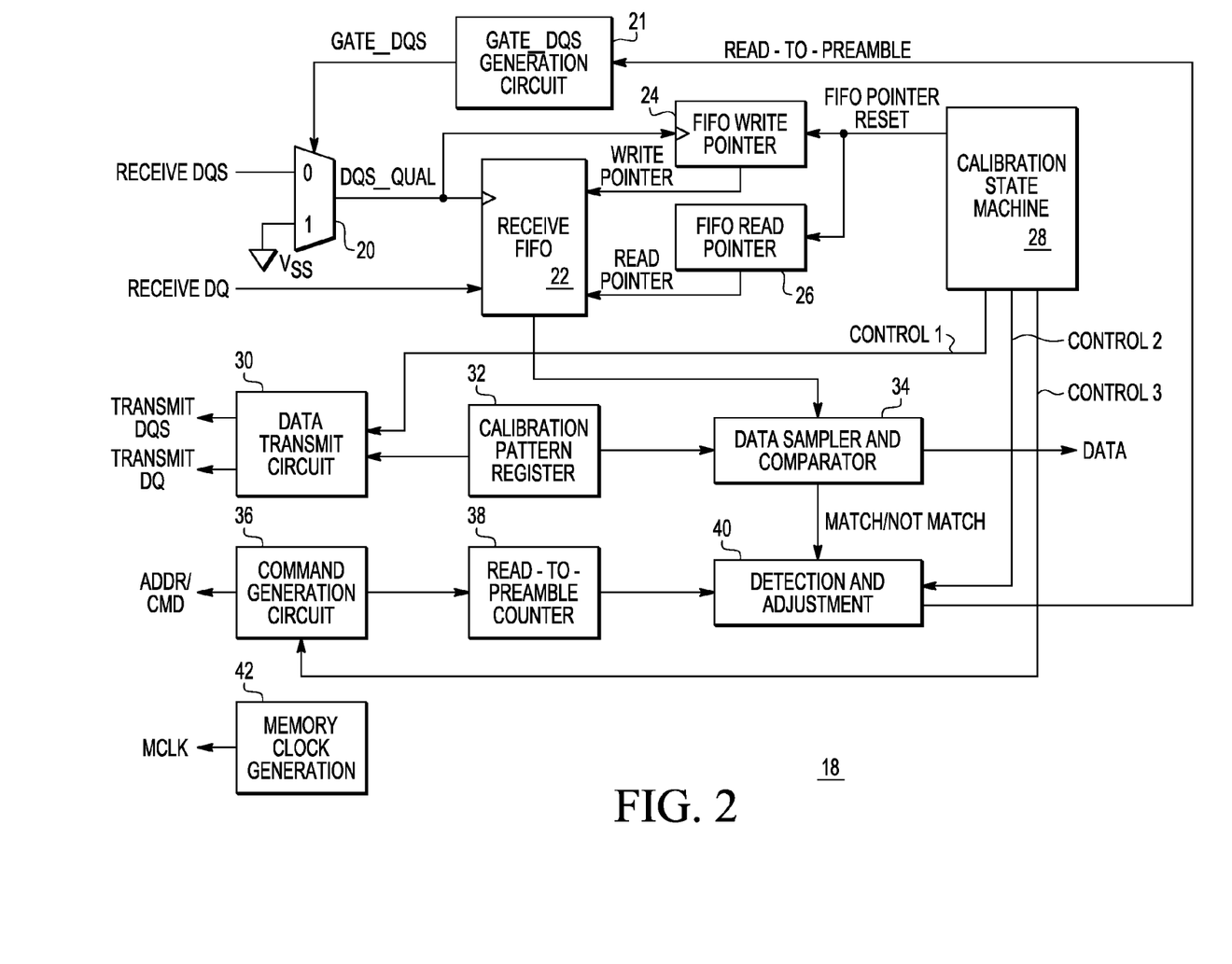
FIG. 2 illustrates, in block diagram form, a portion of the memory controller of FIG. 1.

FIG. 2 illustrates, in block diagram form, a portion of memory controller 18 of FIG. 1. Memory controllers are generally well known. Therefore, only those portions of memory controller 18 useful for describing an embodiment are illustrated. Memory controller 18 includes multiplexer 20, GATE_DQS generation circuit 21, receive FIFO 22, FIFO write pointer 24, FIFO read pointer 26, calibration state machine 28, data transmit circuit 30, calibration pattern register 32, data sampler and comparator 34, command generation circuit 36, read-to-preamble counter 38, detection and adjustment circuit 40, and memory clock generation circuit 42. Multiplexer 20 has a first input for receiving data strobe RECEIVE DQS, a second input coupled to a reference voltage labeled VSS, a control input for receiving gating signal GATE_DQS, and an output for providing internal DQS signal labeled "DQS_QUAL". Note that in other embodiments, multiplexer 20 may be replaced with combinational logic comprising various different logic gates, such as for example, AND logic gates. Internal DQS signal DQS_QUAL is used to clock data into receive FIFO 22. In one embodiment, VSS is a voltage level representing a logic low. In another embodiment, VSS may be a voltage level representing a logic high. Generation circuit 21 has an input for receiving a control signal labeled "READ-to-PREAMBLE", and an output for providing gating signal GATE_DQS. Receive FIFO 22 has a clock input for receiving internal DQS signal DQS_QUAL, a data input for receiving data signal RECEIVE DQ, an output for providing a data signal, an input for receiving a write pointer labeled "WRITE POINTER", and an input for receiving a read pointer labeled "READ POINTER". In another embodiment, READ POINTER may be connected to data sampler and comparator 34 instead of to receive FIFO 22. FIFO write pointer 24 has an input for receiving internal data strobe DQS_QUAL, an input for receiving a reset signal labeled "FIFO POINTER RESET", and an output for providing write pointer WRITE POINTER. FIFO read pointer 26 has an input for receiving reset signal FIFO POINTER RESET, and an output for providing read pointer READ POINTER. Calibration state machine 28 has an output for providing reset signal FIFO POINTER RESET, and outputs for providing control signals labeled "CONTROL 1", "CONTROL 2", and "CONTROL 3". The control signals are used by calibration state machine 28 to control the data capture calibration of memory controller 18. Data transmit circuit 30 has an input for receiving control signal CONTROL 1, an input connected to an output of calibration pattern register 32, an output for providing a data strobe labeled "TRANSMIT DQS", and an output for providing transmit data labeled "TRANSMIT DQ". Calibration pattern register 32 has an output connected to the input of data transmit circuit 30, and an output connected to an input of data sampler and comparator 34. Data sampler and comparator 34 has an input connected to the output of calibration pattern register 32, an input coupled to the output of receive FIFO 22, an output for providing data signals labeled "DATA", and an output for providing a comparison result labeled "MATCH/NOT MATCH". Command generation circuit 36 has an output for providing address and command signal ADDR/CMD, an input for receiving control signal CONTROL 3, and an output connected to an input of read-to-preamble counter 38. Detection and adjustment circuit 40 has an input connected to the output of read-to-preamble counter 38, and input for receiving control signal CONTROL 2, an input for receiving comparison result MATCH/NOT MATCH and an output for providing a control signal labeled "READ-TO-PREAMBLE". Memory clock generation circuit 42 generates and provides memory clock signal MCLK.

Figure 3:
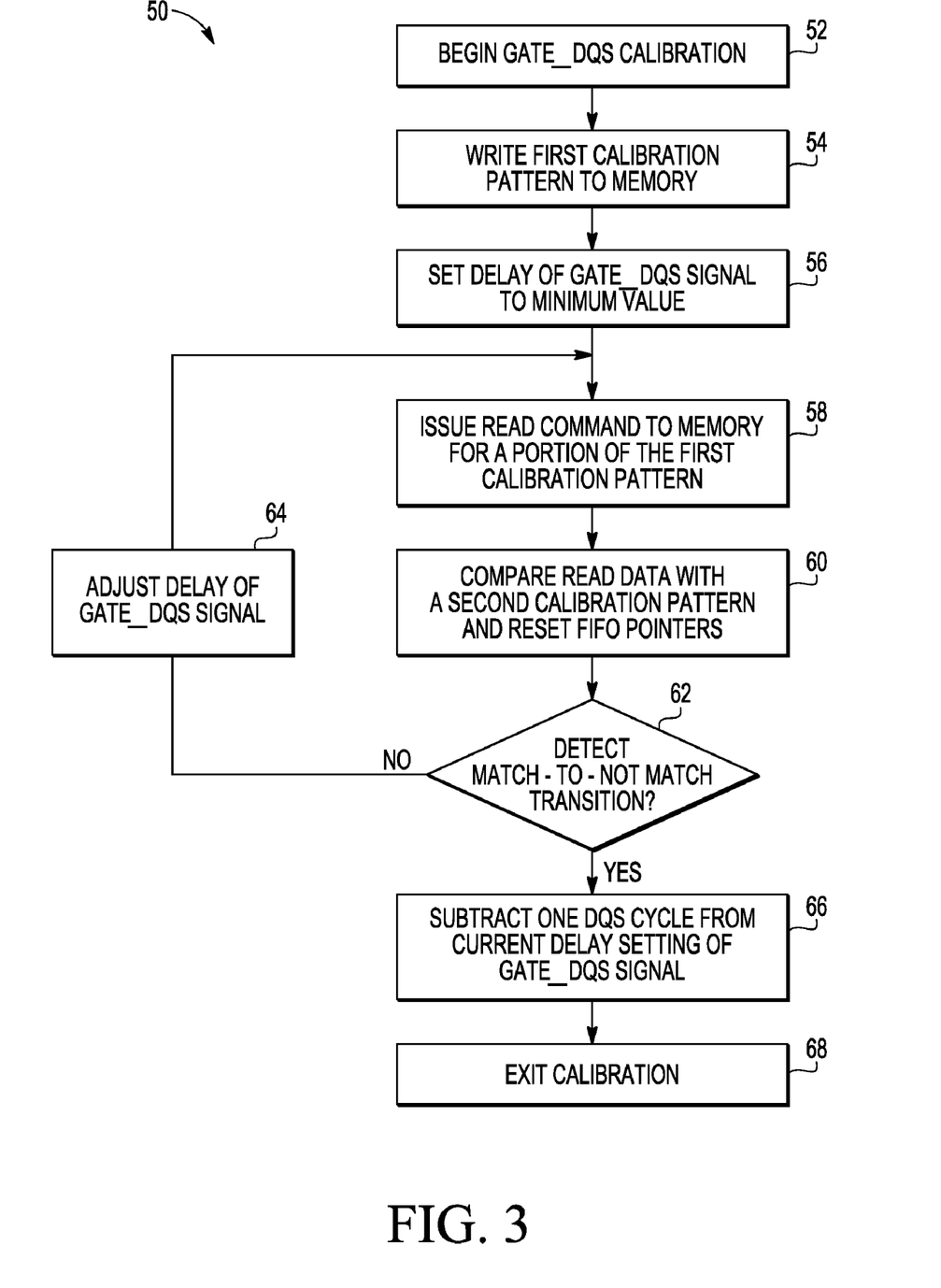
FIG. 3 illustrates a flow chart of a method for calibrating data capture in the memory controller of FIG. 2.

FIG. 3 illustrates a flow chart of method 50 for calibrating data capture in memory controller 18 of FIG. 2. The operation of memory controller 18 will be described with reference to FIG. 2 and FIG. 3.

Prior to reading data from a memory, such as memory 12 of FIG. 1, the timing of signals between memory 12 and memory controller 18 should be synchronized. Before synchronizing the timing, data capture is synchronized by calibrating gating signal GATE_DQS with data strobe DQS. An objective of the data capture calibration is to determined how much time has passed from the issuance of a read command by command generation circuit 36 to receipt of receive DQS signal RECEIVE DQS by detection and adjustment circuit 40. Other synchronizing tests may be performed after data capture is synchronized that will not be described herein.

Method 50 begins at step 52. At step 52, a calibration mode is entered to begin calibration of gating signal GATE_DQS. At step 54, data comprising a first calibration pattern is determined and written to a location in memory 12. The data may include any number of bits and is determined by the number of clock edges used to strobe read data from memory 12. In one embodiment, the number of bits may be eight bytes. In another embodiment, the number of bits may be any number, such as four bytes. There may also be one data strobe per eight bits of data, or another embodiment may provide one data strobe per 4 bits of data. Data transmit circuit 30 provides the first calibration pattern to the location in memory determined by the address information and a write command provided by command generation circuit 36. Read-to-preamble counter 38 is started when command generation circuit 36 issues a read command to memory 12. Read-to-preamble counter 38 will be used to measure the delay for issuance of the read command to receipt of the RECEIVE DQS. GATE_DQS generation circuit 21 can delay gating signal GATE_DQS by a redefined amount. At step 56, the delay provided by GATE_DQS generation circuit is set to a minimum value. In other embodiments, the delay may be set to another value, such as for example, a maximum value. At step 58, command generation circuit 36 issues a read command to read the location in memory 12 having the first calibration pattern. Memory 12 will assert data strobe signal RECEIVE DQS to multiplexer 20 and the first calibration pattern will be provided to the input of receive FIFO 22. Note that if GATE_DQS is asserted too late, then RECEIVE DQS may not arrive at the input of receive FIFO 22 due to the multiplexer 20. Gating signal GATE_DQS will be asserted as a logic low after the minimum delay set at step 56. Signal RECEIVE DQS will be provided at the output of multiplexer 20 as internal data strobe DQS_QUAL. The first calibration pattern will be written to entries of receive FIFO 22 according to the timing set by signal DQS_QUAL. However, if the timing of GATE_DQS is very early or very late, the first calibration pattern may not actually be written to entries of receive FIFO 22.

At step 60, the first calibration pattern stored in receive FIFO 22 will be provided to data sampler and comparator 34. Predetermined entries of receive FIFO 22 will be serially sampled and compared to a second calibration pattern stored in register 32. The first calibration data pattern includes a first portion and a second portion. The first portion will include one data value and the second portion will include a second data value. The second calibration data pattern has the same number of bits as the first portion of the first calibration data pattern. Also, the data value of the second calibration data pattern is predetermined to be equal to the first portion of the first calibration data pattern. On the other hand, the second calibration pattern is predetermined to not be equal to the second portion of the first calibration data pattern Therefore, the first portion of the first calibration pattern and the second calibration pattern will match when compared by data sampler and comparator 34 in a byte-by-byte, or bit-by-bit comparison, and data sampler and comparator 34 will provide a MATCH signal as a result of the comparison. The second portion of the first calibration pattern will not match when compared by data sampler and comparator 34 when compared in a byte-by-byte or bit-by-bit comparison, and data sampler and comparator 34 will provide a NOT MATCH signal as a result of the comparison. For example, in one embodiment where the first and second calibration patterns include eight bytes, the first portion of the first calibration pattern includes the first three bytes and the second portion includes the next five bytes. The second calibration pattern will be the same as the first portion of the first calibration pattern. In another embodiment, the first portion and the second portion may include a different number of bits. Also, in another embodiment, the first portion of the first calibration pattern may be chosen to provide a NOT MATCH signal from data sampler and comparator 34 and the second portion may be chosen to provide a MATCH signal from data sampler and comparator 34 when compared to the second calibration pattern. Also, at step 60, calibration state machine 28 will ensure that the calibration begins with the FIFO pointers set at the first entry of receive FIFO 22.

At decision step 62, data sampler and comparator 34 receives data samples from receive FIFO 22. As stated above, certain predetermined entries of receive FIFO 22 are sampled twice as predetermined consecutive entries and compared to corresponding bits of the second calibration pattern stored in calibration pattern register 32. It is determined if a transition from the first portion of first calibration pattern to the second portion of first calibration pattern is detected by data sampler and comparator 34 within a predetermined time period, that is, two consecutive sample points. In the illustrated embodiment, the two samples are taken on the second and third beats of data. Signal GATE_DQS is calibrated without calibrating the DQS to DQ relationship. In another embodiment, a different number of samples may be taken, and the samples may not be taken on two consecutive entries. The transition from the first portion to the second portion is determined to be detected when a MATCH is followed by a NOT MATCH comparison result. The transition is determined to be not detected if a MATCH is followed by a MATCH or a NOT MATCH is followed by a NOT MATCH. If the transition is not detected, the RECEIVE DQ data is being clocked into receive FIFO 22 on the wrong cycles of data strobe RECEIVE DQS either too late or too early, and the NO path is taken from step 62 to step 64. Because the calibration begins with the gating signal at the minimum delay, at step 64, the delay of gating signal GATE_DQS is incremented by one clock cycle by GATE_DQS generation circuit 21 and the method returns to step 58. In another embodiment, the delay of gating signal GATE_DQS may be adjusted by adding or subtracting another value, such as a fraction of a clock cycle. Steps 58, 60, 62, and 64 are repeated until the MATCH/NOT MATCH transition is detected by detection and adjustment circuit 40. When the MATCH/NOT MATCH transition is detected, the amount of delay necessary for proper data capture has been found and the YES path is taken to step 66. The read-to-preamble counter 38 is stopped and the number of clock cycles of read command to data strobe delay is recorded. The read-to-preamble delay (READ-TO-PREAMBLE) is provided to GATE_DQS generation circuit 21 and is used during normal read operations to delay gating signal GATE_DQS. At step 66, one data strobe DQS clock cycle is subtracted from the adjusted delay of gating signal GATE_DQS to place gating signal GATE_DQS in the middle of the DQS preamble for future reads of memory 12. Another embodiment may subtract a different value from the final result. The adjusted delay is then used for subsequent reads of memory 12. At step 68, the calibration mode is exited.

Figure 4:
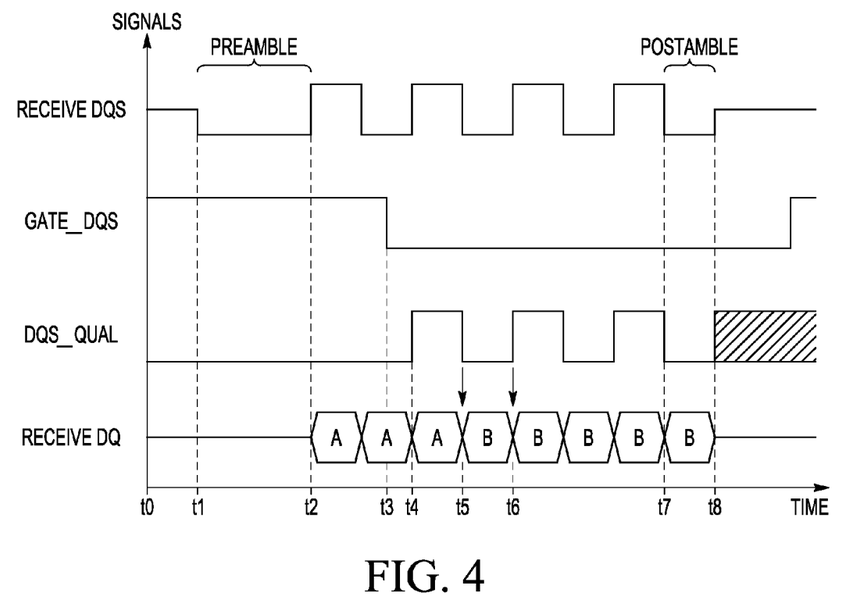
FIG. 4 illustrates a timing diagram of various signals of the memory controller of FIG. 2 when the DQS gating signal switches outside of the proper time window.

FIG. 4 illustrates a timing diagram of various signals of memory controller 18 of FIG. 2 when the DQS gating signal switches outside of the proper time window. Read data strobe RECEIVE DQS has a preamble portion between times t1 and t2, a toggling portion between times t2 and t7, and a postamble portion between times t7 and t8. A first calibration data pattern is illustrated as RECEIVE DQ. Data bits RECEIVE DQ has a first portion of three data "beats" labeled "A" and a second portion of five data "beats" labeled "B". As described above the first portion of the first calibration data pattern "A" is determined to match with a corresponding second calibration data pattern stored in register 32. Likewise, the second portion "B" is determined to not match with the stored calibration pattern of register 32. A transition from the first portion to the second portion is shown at time t5 in FIG. 4. The preamble portion provides a timing window with a known logic level for memory control 18 to enable receive FIFO 22.

In another embodiment, the data capture device may be a different type of data capture device. At time t0, data strobe DQS is tri-stated, GATE_DQS is a logic high causing internal DQS signal DQS_QUAL to be a logic low, and receive data RECEIVE DQ is "don't care". Data begins to be received at the RECEIVE DQS input of multiplexer 20 at time t2, but gating signal GATE_DQS is still a logic high. Because gating signal GATE_DQS has too much delay, gating signal GATE_DQS is not negated until time t3. Internal data strobe DQS_QUAL does not begin toggling until time t4, after two bytes of RECEIVE DQ data have been received and the third data byte labeled "A" is clocked into the first entry of receive FIFO 22 at time t4. Data sampler and comparator 34 samples two data beats as indicated by the arrows pointing to the edges of two "B" samples at times t5 and t6, and thus does not capture "A" data with either the second or third DQS edges. The postamble of RECEIVE DQS is received between times t7 and t8. Internal DQS signal DQS_QUAL will become invalid after time t8. As indicated in method 50 described above, the delay of gating signal GATE_DQS is adjusted in accordance with the described embodiment to correct the timing of GATE_DQS.

Figure 5:
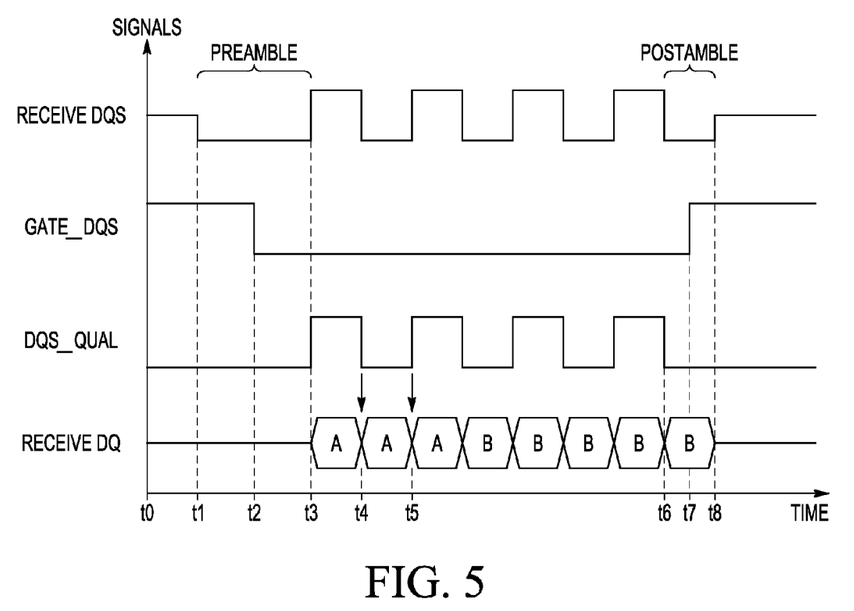
FIG. 5 illustrates a timing diagram of various signals of the memory controller of FIG. 2 when the DQS gating signal switches inside of the proper time window.

FIG. 5 illustrates a timing diagram of various signals of the memory controller of FIG. 2 when the DQS gating signal switches inside of the proper time window. FIG. 5 illustrates the same signals illustrated in FIG. 4, except gating signal GATE_DQS has the correct amount of delay. At time t0, RECEIVE DQS is tri-stated, GATE_DQS is a logic high, internal DQS signal DQS_QUAL is a logic low, and data signals RECEIVE DQ is "don't care". Time t1 begins the preamble portion of RECEIVE DQS. Gating signal GATE_DQS is negated as a logic low at time t2, which is in the middle of the preamble portion of RECEIVE DQS. Internal data strobe DQS_QUAL begins toggling, and receive data RECEIVE DQS arrives at time t3. As can be seen, the first data byte arrives coincident with the first rising edge of internal date strobe DQS_QUAL. At time t6, the last byte of data is stored in receive FIFO 22. At time t7, gating signal GATE_DQS returns to a logic high, causing internal data strobe DQS_QUAL to be a logic low. The end of the postamble is at time t8. Note that only the data samples from times t4 and t5, representing the second and third DQS edges, respectively, will be compared with the second calibration pattern stored in register 32, which will compare correctly in this example. In the illustrated embodiment, the calibration operation will complete with GATE_DQS near the end of the first high DQS pulse. In the illustrated embodiment, subtracting one clock cycle (step 66 of FIG. 3) will place the GATE_DQS signal back in the middle of the preamble. In another embodiment, subtracting one clock cycle may not be necessary.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of data processor 14 are circuitry located on a single integrated circuit or within a same device. Alternatively, data processor 14 may include any number of separate integrated circuits or separate devices interconnected with each other. Also for example, data processor 14 or portions thereof may be soft or code representations of physical circuitry or of logical representations convertible into physical circuitry. As such, data processor 14 may be embodied in a hardware description language of any appropriate type.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method comprising:
   writing data comprising a first plurality of bits to a first memory, a first portion of the first plurality of bits being predetermined to match in a comparison with a second plurality of bits stored in a second memory, and a second portion of the first plurality of bits being predetermined to not match in a comparison with the second plurality of bits;
   setting a time delay of a gating signal to a first value, the gating signal for aligning data read from the first memory to a clock signal;
   serially reading the first plurality of bits from the first memory;
   comparing the first plurality of bits to the second plurality of bits;
   detecting if a transition from the first portion of the first plurality of bits to the second portion of the first plurality of bits occurs within a time period;
   if the transition occurs within the time period, resetting the first value of the time delay of the gating signal by a second value; and
   if the transition occurs outside of the time period, adjusting the delay of the gating signal to a third value and repeating the steps of serially reading, comparing, detecting, and adjusting until the transition occurs within the time period.

2. The method of claim 1, wherein writing data comprising a first plurality of bits to a first memory further comprises writing data comprising a first plurality of bits to a double data rate synchronous dynamic random access memory.

3. The method of claim 1, wherein writing data comprising a first plurality of bits to a first memory further comprises writing data comprising a first plurality of bits to first memory, the first memory being a dual data rate synchronous dynamic random access memory, a first portion of the first plurality of bits being predetermined to match in a comparison with a second plurality of bits stored in a second memory, the second memory being a internal register, and the second portion of the first plurality of bits being predetermined to not match in a comparison with the second plurality of bits.

4. The method of claim 1, wherein setting a time delay of the gating signal to the first value further comprises setting a time delay of the gating signal to the first value, wherein the first value is a minimum value.

5. The method of claim 1, wherein adjusting the delay of the gating signal to a third value further comprises adjusting the delay of the gating signal to a third value by incrementing the delay of the gating signal by less than one cycle of the clock signal.

6. The method of claim 1, wherein resetting the first value of the time delay of the gating signal by a second value further comprises resetting the first value of the time delay of the gating signal by subtracting one cycle of the clock signal from the first value.

7. The method of claim 1, wherein serially reading the first plurality of bits from the first memory further comprises writing the serially read first plurality of bits to a first-in, first-out memory (FIFO).

8. The method of claim 7, wherein comparing the first plurality of bits to the second plurality of bits further comprises reading the first plurality of bits from the FIFO and to an input of a comparator for performing the comparing.

9. The method of claim 1, further comprising reading from the first memory using the gating signal having the time delay reset by the second value, wherein the reading is subsequent to the step of resetting the first value of the gating signal.

10. In a data processing system having a memory controller for controlling access to a memory, a method for calibrating a gating signal with data read from the memory, the gating signal for aligning the data to a clock signal, the method comprising:
    entering a gating signal calibration mode;
    writing a first calibration data pattern to the memory, the first calibration data pattern having a first portion and a second portion;
    writing a second calibration data pattern to a register in the memory controller, the second calibration data pattern being equal to the first portion of the first calibration data pattern, and the second calibration pattern not being equal to the second portion of the first calibration data pattern;
    setting a time delay of the gating signal to a first value;
    reading the first calibration data pattern from the memory to the memory controller;
    comparing the first calibration data pattern to the second calibration data pattern bit-by-bit in response to the gating signal;
    detecting if a transition from the first portion of the first calibration data pattern to the second portion of the first calibration data pattern occurs within a time period; and
    if the transition does not occur within the time period, adjusting the time delay of the gating signal by a second value.

11. The method of claim 10, further comprising:
    re-reading the first calibration data pattern from the memory to the memory controller,
    comparing the first calibration data pattern to the second calibration data pattern bit-by-bit in response to the adjusted gating signal;
    detecting if a transition from the first portion of the first calibration data pattern to the second portion of the first calibration data pattern occurs within the time period;
    if the transition occurs within the time period, adjusting the adjusted gating signal by a third value; and
    exiting the calibration mode.

12. The method of claim 11, further comprising reading the data from the memory using the adjusted gating signal.

13. The method of claim 10, wherein reading the first calibration data pattern from the memory to the memory controller further comprises writing the first calibration data pattern to a first-in, first-out memory (FIFO) of the memory controller.

14. The method of claim 13, wherein comparing the first calibration data pattern to the second calibration data pattern further comprises resetting a write pointer of the FIFO to a first entry of the FIFO.

15. The method of claim 14, wherein detecting if a transition from the first portion of the first calibration data pattern to the second portion of the first calibration data pattern further comprises determining if the transition occurs at a predetermined entry of the FIFO.

16. A memory controller comprising:
    a logic circuit having a first input for receiving a clock signal, a second input coupled to a reference voltage, a control input for receiving a gating signal, and an output;
    a first-in, first-out memory (FIFO) having a clock input coupled to the output of the logic circuit, a data input coupled to receive data from a memory, and an output;
    a comparator having a first input coupled to a the output of the FIFO, a second input coupled to receive a calibration pattern, the calibration pattern predetermined to match with a first portion of data from the FIFO, and the calibration pattern predetermined to not match with a second portion of data from the FIFO; and a detection and adjustment circuit for detecting if a transition from the first portion of the data to the second portion of the data occurs within a predetermined time period, and in response to detecting that the transition does not occur within the predetermined time period, causing a timing of the gating signal to be adjusted.

17. The memory controller of claim 16, wherein the memory is characterized as being a double data rate synchronous dynamic random access memory.

18. The memory controller of claim 16, wherein the clock signal comprises a preamble portion, a toggling portion, and a postamble portion.

19. The memory controller of claim 18, wherein the data is loaded into the FIFO on both rising and falling edges of the toggling portion of the clock signal.

20. The memory controller of claim 16, wherein the FIFO further comprises a read pointer, wherein the transition occurs on a predetermined read pointer location when the transition is within the predetermined time period.

\* \* \* \* \*